US009659609B2

(12) United States Patent
Hong (10) Patent No.: US 9,659,609 B2
(45) Date of Patent: May 23, 2017

(54) SEMICONDUCTOR MEMORY APPARATUS AND SYSTEM USING THE SAME

(71) Applicant: SK hynix Inc., Icheon-si Gyeonggi-do (KR)

(72) Inventor: Yun Gi Hong, Icheon-si Gyeonggi-do (KR)

(73) Assignee: SK hynix Inc., Icheon-Si (KR)

( * ) Notice: Subject to any disclaimer, the term of this patent is extended or adjusted under 35 U.S.C. 154(b) by 123 days.

(21) Appl. No.: 14/329,622

(22) Filed: Jul. 11, 2014

(65) Prior Publication Data

US 2015/0287446 A1 Oct. 8, 2015

(30) Foreign Application Priority Data

Apr. 3, 2014 (KR) .................. 10-2014-0040107

(51) Int. Cl.
*G11C 7/10* (2006.01)
*G11C 7/22* (2006.01)

(52) U.S. Cl.
CPC ............ *G11C 7/1009* (2013.01); *G11C 7/109* (2013.01); *G11C 7/1084* (2013.01); *G11C 7/1093* (2013.01); *G11C 7/1096* (2013.01); *G11C 7/22* (2013.01)

(58) Field of Classification Search
CPC ...... G11C 7/1009; G11C 7/1084; G11C 7/109
USPC ........................................................ 365/103
See application file for complete search history.

(56) References Cited

U.S. PATENT DOCUMENTS

| | | | | |
|---|---|---|---|---|
| 2013/0111102 A1* | 5/2013 | Kim | ............... | G11C 7/1006 711/101 |
| 2013/0223140 A1* | 8/2013 | Sohn | ............... | G11C 11/1675 365/158 |
| 2013/0227210 A1* | 8/2013 | Walker | ............... | G11C 7/02 711/105 |
| 2013/0311717 A1* | 11/2013 | Kim | ............... | G06F 12/0246 711/104 |
| 2013/0339641 A1* | 12/2013 | Ok | ............... | G06F 12/0646 711/158 |

FOREIGN PATENT DOCUMENTS

KR 1020110101012 A 9/2011

* cited by examiner

*Primary Examiner* — Son Mai
*Assistant Examiner* — Muna A Techane
(74) *Attorney, Agent, or Firm* — William Park & Associates Ltd.

(57) ABSTRACT

A semiconductor memory apparatus includes a command input unit configured to generate an internal command in response to an external command and a selective input unit configured to transmit selection signals to one of a first internal circuit. The selective input unit transmits the selection signals to the first internal circuit when the internal command is not a predetermined command and transmits the selection signals to the second internal circuit when the internal command is the predetermined command.

20 Claims, 5 Drawing Sheets

SEMICONDUCTOR MEMORY APPARATUS AND SYSTEM USING THE SAME

CROSS-REFERENCES TO RELATED APPLICATION

The present application claims priority under 35 U.S.C. §119(a) to Korean application number 10-2014-0040107 filed on Apr. 3, 2014, in the Korean Intellectual Property Office, which is incorporated herein by reference in its entirety.

BACKGROUND

1. Technical Field

Embodiments of the present invention generally relate to semiconductor integrated circuits, and more particularly, in one or more embodiments, to semiconductor memory apparatus and systems using the same.

2. Related Art

Electronic systems typically include one or more semiconductor memory apparatus which may be accessed by various other components in the electronic system. For instance, the semiconductor memory apparatus may be accessed by a controller, which provides control signals such as commands or addresses to the semiconductor memory apparatus so that it can receive and store data, and output stored data.

Some modern semiconductor memory apparatus employ data-mask and data bus inversion to enhance data transmission.

Such semiconductor memory apparatus need to be provided with additional signals for controlling data-mask and data bus inversion from the controller. This may cause increase in the number of signal lines.

SUMMARY

In an embodiment of the present disclosure, a semiconductor memory apparatus includes: a selective input unit configured to transmit selection signals to one of a first internal circuit and a second internal circuit in response to a specified command; and a command input unit configured to generate the specified command in response to an external command.

In an embodiment of the present disclosure, a semiconductor memory apparatus includes: an address input unit configured to be inputted with partial addresses of addresses, as selection addresses, and be directly inputted with remaining addresses of the addresses from a controller; a data processing unit configured to be inputted with data and DM/DBI information signals; and a selective input unit configured to transmit selection signals which are inputted from an exterior, as the selection addresses, to the address input unit, or transmit the selection signals, as the DM/DBI information signals, to the data processing unit, in response to a specified command.

In an embodiment of the present disclosure, a system includes: a controller configured to output addresses, selection signals, data and a command; and a semiconductor memory apparatus configured to be inputted with the addresses, the selection signals, the data and the command, and use the selection signals from partial addresses of the addresses or use the selection signals from DM/DBI information signals, in response to the command.

BRIEF DESCRIPTION OF THE DRAWINGS

Features, aspects, and embodiments are described in conjunction with the attached drawings, in which.

DETAILED DESCRIPTION

Figure 1:
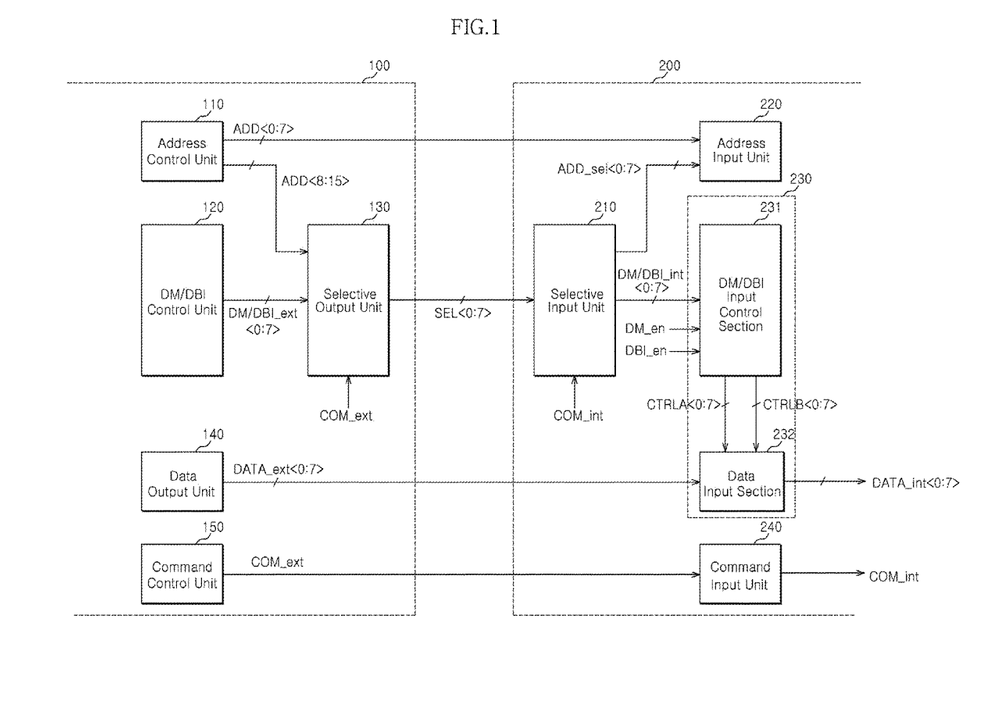
FIG. 1 is a configuration diagram of a semiconductor memory apparatus and a system using the same in accordance with an embodiment of the present disclosure.

An example of a system which includes a semiconductor memory in accordance with an embodiment of the present disclosure is shown in FIG. 1.

As shown in FIG. 1, a system in accordance with an embodiment of the present disclosure may include a controller 100 and a semiconductor memory apparatus 200.

The controller 100 provides addresses ADD<0:15>, DM/DBI information signals DM/DBI_ext<0:7>, data DATA_ext<0:7> and a command COM_ext to the semiconductor memory apparatus 200. The "DM" refers to data masking and the "DBI" refers to data bus inversion. The controller 100 provides selection signals SEL<0:7> to the semiconductor memory apparatus 200 in response to the command COM_ext. The controller 100 may generate the selection signals SEL<0:7> using partial addresses, which are part of the addresses ADD<0:15>, and the DM/DBI information signals DM/DBI_ext<0:7>. For example, the controller 100 may provide partial addresses ADD<8:15> as the selection signals SEL<0:7> to the semiconductor memory apparatus 200 in response to the command COM_ext. For example, the controller 100 may provide the DM/DBI information signals DM/DBI_ext<0:7> as the selection signals SEL<0:7> to the semiconductor memory apparatus 200. In an embodiment of the present invention, the controller 100 outputs the DM/DBI information signals DM/DBI_ext<0:7> as the selection signals SEL<0:7> when the command COM_ext is a predetermined command (e.g., a read command or a write command), and outputs the partial addresses ADD<8:15> as the selection signals SEL<0:7> when the command COM_ext is not the predetermined command.

In an embodiment of the present invention, the controller 100 includes an address control unit 110, a DM/DBI control unit 120, a selective output unit 130, a data output unit 140, and a command control unit 150.

The address control unit 110 outputs the addresses ADD<0:15>. The address control unit 110 outputs first partial addresses ADD<8:15>, which are part of the addresses ADD<0:15>, to the selective output unit 130, and outputs second partial addresses ADD<0:7>, which are part of the addresses ADD<0:15>, to the semiconductor memory apparatus 200.

The DM/DBI control unit 120 outputs the DM/DBI information signals DM/DBI_ext<0:7>.

The selective output unit 130 is inputted with the first partial addresses ADD<8:15> and the DM/DBI information signals DM/DBI_ext<0:7>, and outputs ones of the first partial addresses ADD<8:15> and the DM/DBI information signals DM/DBI_ext<0:7> as the selection signals SEL<0:7> in response to the command COM_ext. For example, the selective output unit 130 outputs the DM/DBI information signals DM/DBI_ext<0:7> as the selection signals SEL<0:7> when the command COM_ext is a predetermined command (e.g., the read command or the write command), and outputs the first partial addresses ADD<8:15> as the selection signals SEL<0:7> when the command COM_ext is not the predetermined command.

The data output unit 140 outputs the data DATA_ext<0: 7>.

The command control unit 150 outputs a command COM_ext for operating the semiconductor memory apparatus 200.

The semiconductor memory apparatus 200 operates by using the addresses ADD<0:15>, the data DATA_ext<0:7>, and the command COM_ext. The semiconductor memory apparatus 200 may receive the first partial addresses ADD<8:15> or the DM/DBI information signals DM/DBI_ext<0:7> as the selection signals SEL<0:7>. For example, the semiconductor memory apparatus 200 is inputted with the DM/DBI information signals DM/DBI_ext<0: 7> as the selection signals SEL<0:7> when the command COM_ext is a predetermined command, and is inputted with the first partial addresses ADD<8:15> as the selection signals SEL<0:7> when the command COM_ext is not the predetermined command.

In an embodiment of the present invention, the semiconductor memory apparatus 200 includes a selective input unit 210, an address input unit 220, a data processing unit 230, and a command input unit 240.

The selective input unit 210 outputs selection addresses ADD_sel<0:7> and DM/DBI information signals DM/DBI_int<0:7> in response to the selection signals SEL<0:7> and the command COM_ext. For example, the selective input unit 210 may output the selection signals SEL<0:7> as the selection addresses ADD_sel<0:7> or the DM/DBI information signals DM/DBI_int<0:7>. The command COM_ext may be generated at the command control unit 150 of the controller 100. In an embodiment of the present invention, the selective input unit 210 outputs the selection signals SEL<0:7> as the DM/DBI information signals DM/DBI_int<0:7> when the command COM_ext is a predetermined command (e.g., the read command or the write command), and outputs the selection signals SEL<0:7> as the selection addresses (ADD_sel<0:7>) when the command COM_ext is not the predetermined command.

The address input unit 220 receives the second partial addresses ADD<0:7> and the selection addresses ADD_sel<0:7>. The second partial addresses ADD<0:7> are outputted from the address control unit 110 of the controller 100. For example, the address input unit 220 may receive the second partial addresses ADD<0:7> or may receive the second partial addresses ADD<0:7> and the selection addresses ADD_sel<0:7>. The address input unit 220 may receive first partial addresses in the form of selection addresses and second partial addresses in the form of addresses. The addresses that the address input unit 220 receives may vary depending on what the command is. For example, the address input unit 220 receives only the second partial addresses ADD<0:7> if a predetermined command is activated, whereas the address input unit 220 receives the entire addresses ADD<0:15> if the predetermined command is not activated.

The data processing unit 230 may generate internal data DATA_int<0:7> by inverting or by masking off the data DATA_ext<0:7> outputted from the data output unit 140 in response to the DM/DBI information signals DM/DBI_int<0:7>. If the data processing unit 230 masks off data, the semiconductor memory apparatus 200 does not write the data in its memory cells.

The data processing unit 230 includes a DM/DBI input control section 231 and a data input section 232.

The DM/DBI input control section 231 generates first and second control signals CTRLA<0:7> and CTRLB<0:7> in response to a DM enable signal DM_en, a DBI enable signal DBI_en and the DM/DBI information signals DM/DBI_int<0:7>. For example, the DM/DBI input control section 231 outputs the DM/DBI information signals DM/DBI_int<0:7> as the first data control signals CTRLA<0:7> when the DM enable signal DM_en is enabled, and outputs the DM/DBI information signals DM/DBI_int<0:7> as the second data control signals CTRLB<0:7> when the DBI enable signal DBI_en is enabled. The DM enable signal DM_en and the DBI enable signal DBI_en may be outputted from a mode register which stores information with respect to the operation modes and detailed configurations of the semiconductor memory apparatus 200.

The data input section 232 inverts or masks off data in response to the first and second data control signals CTRLA<0:7> and CTRLB<0:7>.

The command input unit 240 generates an internal command COM_int for controlling the operation of the semiconductor memory apparatus 200, in response to the command COM_ext outputted from the command control unit 150 of the controller 100. The command input unit 240 generates the internal command COM_int to control the semiconductor memory apparatus 200 in response to the command COM_ext outputted from the command control unit 150. The selective input unit 210 may generate the DM/DBI information signals DM/DBI_int<0:7> and the selection addresses ADD_sel<0:7> in response to the selection signals SEL<0:7> and the internal command COM_int.

Figure 2:
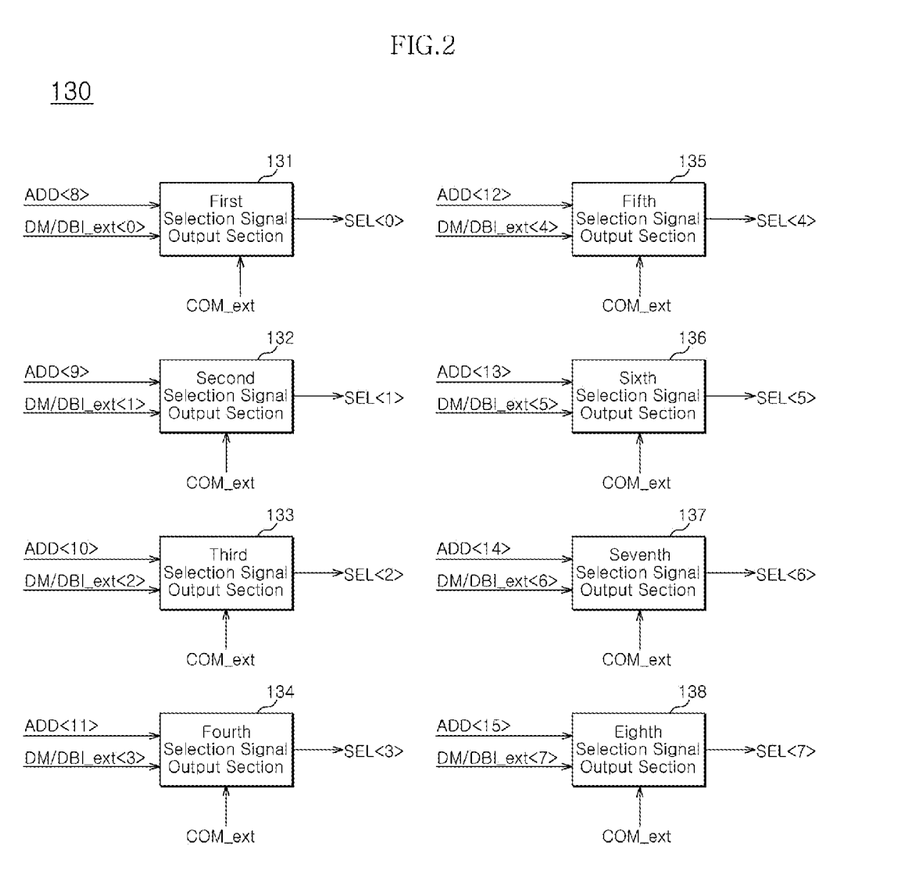
FIG. 2 is a configuration diagram of the selective output unit shown in FIG. 1.

As shown in FIG. 2, the selective output unit 130 may include first to eighth selection signal output sections 131 to 138.

The first selection signal output section 131 outputs the first address ADD<8> of the first partial addresses ADD<8: 15> or the first DM/DBI information signal DM/DBI_ext<0> of the DM/DBI information signals DM/DBI_ext<0:7>, as the first selection signal SEL<0> of the selection signals SEL<0:7>, in response to the command COM_ext. For example, the first selection signal output section 131 outputs the first DM/DBI information signal DM/DBI_ext<0> as the first selection signal SEL<0> when the command COM_ext is a predetermined command, and outputs the first address ADD<8> as the first selection signal SEL<0> when the command COM_ext is not the predetermined command.

The second selection signal output section 132 outputs the second address ADD<9> of the first partial addresses ADD<8:15> or the second DM/DBI information signal DM/DBI_ext<1> of the DM/DBI information signals DM/DBI_ext<0:7>, as the second selection signal SEL<1> of the selection signals SEL<0:7>, in response to the command COM_ext. For example, the second selection signal output section 132 outputs the second DM/DBI information signal DM/DBI_ext<1> as the second selection signal SEL<1> when the command COM_ext is a predetermined command, and outputs the second address ADD<9> as the second selection signal SEL<1> when the command COM_ext is not the predetermined command.

The third selection signal output section 133 outputs the third address ADD<10> of the first partial addresses ADD<8:15> or the third DM/DBI information signal DM/DBI_ext<2> of the DM/DBI information signals DM/DBI_ext<0:7>, as the third selection signal SEL<2> of the selection signals SEL<0:7>, in response to the command COM_ext. For example, the third selection signal output section 133 outputs the third DM/DBI information signal DM/DBI_ext<2> as the third selection signal SEL<2> when the command COM_ext is a predetermined command, and outputs the third address ADD<10> as the third selection signal SEL<2> when the command COM_ext is not the predetermined command.

The fourth selection signal output section 134 outputs the fourth address ADD<11> of the first partial addresses ADD<8:15> or the fourth DM/DBI information signal DM/DBI_ext<3> of the DM/DBI information signals DM/DBI_ext<0:7>, as the fourth selection signal SEL<3> of the selection signals SEL<0:7>, in response to the command COM_ext. For example, the fourth selection signal output section 134 outputs the fourth DM/DBI information signal DM/DBI_ext<3> as the fourth selection signal SEL<3> when the command COM_ext is a predetermined command, and outputs the fourth address ADD<11> as the fourth selection signal SEL<3> when the command COM_ext is not the predetermined command.

The fifth selection signal output section 135 outputs the fifth address ADD<12> of the first partial addresses ADD<8:15> or the fifth DM/DBI information signal DM/DBI_ext<4> of the DM/DBI information signals DM/DBI_ext<0:7>, as the fifth selection signal SEL<4> of the selection signals SEL<0:7>, in response to the command COM_ext. For example, the fifth selection signal output section 135 outputs the fifth DM/DBI information signal DM/DBI_ext<4> as the fifth selection signal SEL<4> when the command COM_ext is a predetermined command, and outputs the fifth address ADD<12> as the fifth selection signal SEL<4> when the command COM_ext is not the predetermined command.

The sixth selection signal output section 136 outputs the sixth address ADD<13> of the first partial addresses ADD<8:15> or the sixth DM/DBI information signal DM/DBI_ext<5> of the DM/DBI information signals DM/DBI_ext<0:7>, as the sixth selection signal SEL<5> of the selection signals SEL<0:7>, in response to the command COM_ext. For example, the sixth selection signal output section 136 outputs the sixth DM/DBI information signal DM/DBI_ext<5> as the sixth selection signal SEL<5> when the command COM_ext is a predetermined command, and outputs the sixth address ADD<13> as the sixth selection signal SEL<5> when the command COM_ext is not the predetermined command.

The seventh selection signal output section 137 outputs the seventh address ADD<14> of the first partial addresses ADD<8:15> or the seventh DM/DBI information signal DM/DBI_ext<6> of the DM/DBI information signals DM/DBI_ext<0:7>, as the seventh selection signal SEL<6> of the selection signals SEL<0:7>, in response to the command COM_ext. For example, the seventh selection signal output section 137 outputs the seventh DM/DBI information signal DM/DBI_ext<6> as the seventh selection signal SEL<6> when the command COM_ext is a predetermined command, and outputs the seventh address ADD<14> as the seventh selection signal SEL<6> when the command COM_ext is not the predetermined command.

The eighth selection signal output section 138 outputs the eighth address ADD<15> of the first partial addresses ADD<8:15> or the eighth DM/DBI information signal DM/DBI_ext<7> of the DM/DBI information signals DM/DBI_ext<0:7>, as the eighth selection signal SEL<7> of the selection signals SEL<0:7>, in response to the command COM_ext. For example, the eighth selection signal output section 138 outputs the eighth DM/DBI information signal DM/DBI_ext<7> as the eighth selection signal SEL<7> when the command COM_ext is a predetermined command, and outputs the eighth address ADD<15> as the eighth selection signal SEL<7> when the command COM_ext is not the predetermined command. Each of the first to eighth selection signal output sections 131 to 138 may include one or more of a multiplexer and a switch.

Figure 3:
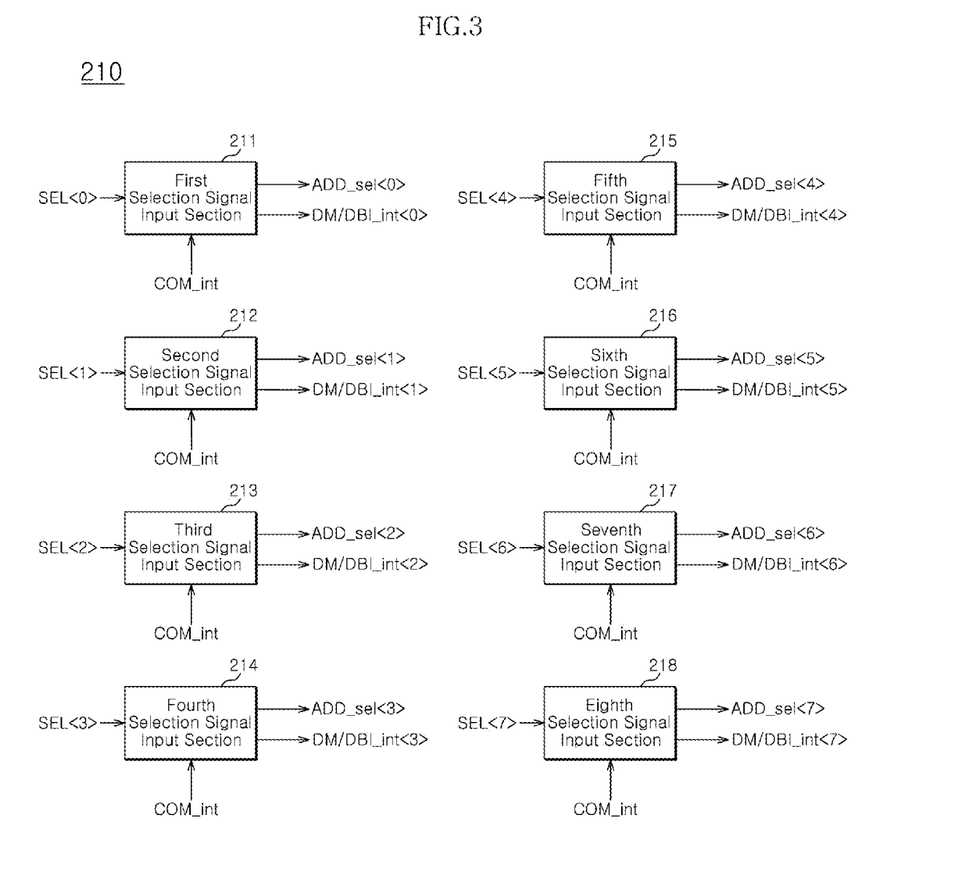
FIG. 3 is a configuration diagram of the selective input unit shown in FIG. 1.

As shown in FIG. 3, the selective input unit 210 includes first to eighth selection signal input sections 211 to 218.

The first selection signal input section 211 outputs the first selection signal SEL<0> of the selection signals SEL<0:7> as the first selection address ADD_sel<0> of the selection addresses ADD_sel<0:7> or the first DM/DBI information signal DM/DBI_int<0> of the DM/DBI information signals DM/DBI_int<0:7>, in response to the internal command COM_int. For example, the first selection signal input section 211 outputs the first selection signal SEL<0> as the first DM/DBI information signal DM/DBI_int<0> when the internal command COM_int is a predetermined command, and outputs the first selection signal SEL<0> as the first selection address ADD_sel<0> when the internal command COM_int is not the predetermined command.

The second selection signal input section 212 outputs the second selection signal SEL<1> of the selection signals SEL<0:7> as the second selection address ADD_sel<1> of the selection addresses ADD_sel<0:7> or the second DM/DBI information signal DM/DBI_int<1> of the DM/DBI information signals DM/DBI_int<0:7>, in response to the internal command COM_int. For example, the second selection signal input section 212 outputs the second selection signal SEL<1> as the second DM/DBI information signal DM/DBI_int<1> when the internal command COM_int is a predetermined command, and outputs the second selection signal SEL<1> as the second selection address ADD_sel<1> when the internal command COM_int is not the predetermined command.

The third selection signal input section 213 outputs the third selection signal SEL<2> of the selection signals SEL<0:7> as the third selection address ADD_sel<2> of the selection addresses ADD_sel<0:7> or the third DM/DBI information signal DM/DBI_int<2> of the DM/DBI information signals DM/DBI_int<0:7>, in response to the internal command COM_int. For example, the third selection signal input section 213 outputs the third selection signal SEL<2> as the third DM/DBI information signal DM/DBI_int<2> when the internal command COM_int is a predetermined command, and outputs the third selection signal SEL<2> as the third selection address ADD_sel<2> when the internal command COM_int is not the predetermined command.

The fourth selection signal input section 214 outputs the fourth selection signal SEL<3> of the selection signals SEL<0:7> as the fourth selection address ADD_sel<3> of the selection addresses ADD_sel<0:7> or the fourth DM/DBI information signal DM/DBI_int<3> of the DM/DBI information signals DM/DBI_int<0:7>, in response to the internal command COM_int. For example, the fourth selection signal input section 214 outputs the fourth selection signal SEL<3> as the fourth DM/DBI information signal DM/DBI_int<3> when the internal command COM_int is a predetermined command, and outputs the fourth selection signal SEL<3> as the fourth selection address ADD_sel<3> when the internal command COM_int is not the predetermined command.

The fifth selection signal input section 215 outputs the fifth selection signal SEL<4> of the selection signals SEL<0:7> as the fifth selection address ADD_sel<4> of the selection addresses ADD_sel<0:7> or the fifth DM/DBI information signal DM/DBI_int<4> of the DM/DBI information signals DM/DBI_int<0:7>, in response to the internal command COM_int. For example, the fifth selection signal input section 215 outputs the fifth selection signal SEL<4> as the fifth DM/DBI information signal DM/DBI_int<4> when the internal command COM_int is a predetermined command, and outputs the fifth selection signal SEL<4> as the fifth selection address ADD_sel<4> when the internal command COM_int is not the predetermined command.

The sixth selection signal input section 216 outputs the sixth selection signal SEL<5> of the selection signals SEL<0:7> as the sixth selection address ADD_sel<5> of the selection addresses ADD_sel<0:7> or the sixth DM/DBI information signal DM/DBI_int<5> of the DM/DBI information signals DM/DBI_int<0:7>, in response to the internal command COM_int. For example, the sixth selection signal input section 216 outputs the sixth selection signal SEL<5> as the sixth DM/DBI information signal DM/DBI_int<5> when the internal command COM_int is a predetermined command, and outputs the sixth selection signal SEL<5> as the sixth selection address ADD_sel<5> when the internal command COM_int is not the predetermined command.

The seventh selection signal input section 217 outputs the seventh selection signal SEL<6> of the selection signals SEL<0:7> as the seventh selection address ADD_sel<6> of the selection addresses ADD_sel<0:7> or the seventh DM/DBI information signal DM/DBI_int<6> of the DM/DBI information signals DM/DBI_int<0:7>, in response to the internal command COM_int. For example, the seventh selection signal input section 217 outputs the seventh selection signal SEL<6> as the seventh DM/DBI information signal DM/DBI_int<6> when the internal command COM_int is a predetermined command, and outputs the seventh selection signal SEL<6> as the seventh selection address ADD_sel<6> when the internal command COM_int is not the predetermined command.

The eighth selection signal input section 218 outputs the eighth selection signal SEL<7> of the selection signals SEL<0:7> as the eighth selection address ADD_sel<7> of the selection addresses ADD_sel<0:7> or the eighth DM/DBI information signal DM/DBI_int<7> of the DM/DBI information signals DM/DBI_int<0:7>, in response to the internal command COM_int. For example, the eighth selection signal input section 218 outputs the eighth selection signal SEL<7> as the eighth DM/DBI information signal DM/DBI_int<7> when the internal command COM_int is a predetermined command, and outputs the eighth selection signal SEL<7> as the eighth selection address ADD_sel<7> when the internal command COM_int is not the predetermined command. Each of the first to eighth selection signal input sections 211 to 218 may include one or more of a demultiplexer and a switch.

Figure 4:
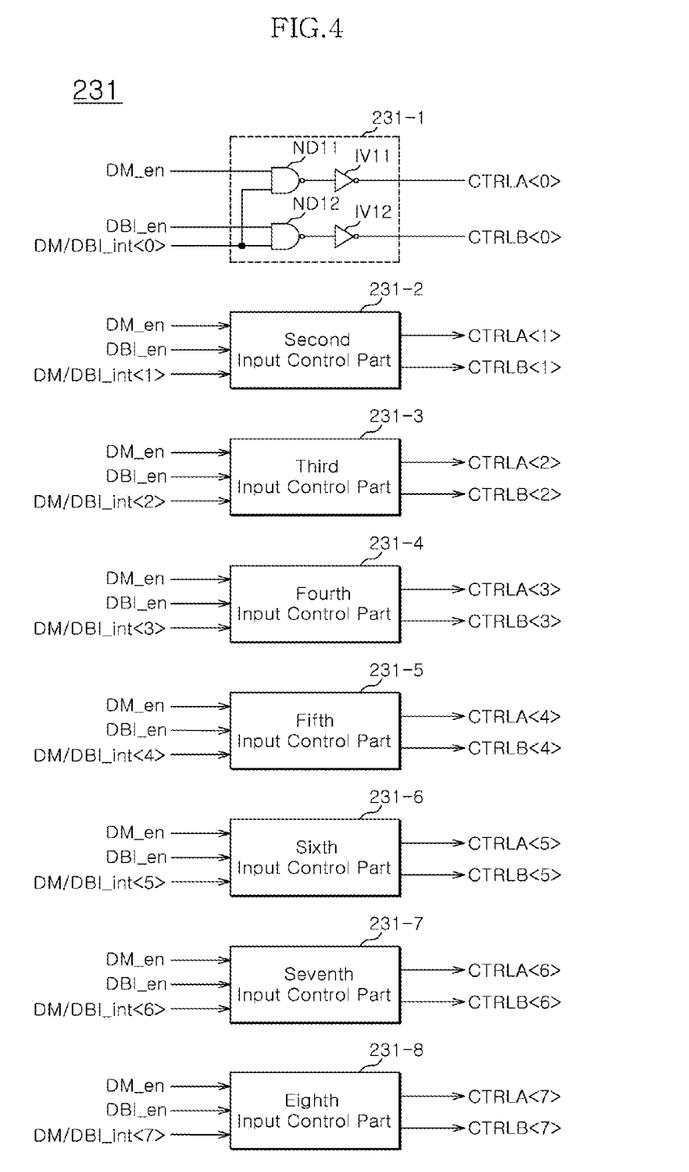
FIG. 4 is a configuration diagram of the DM/DBI input control section shown in FIG. 1.

As shown in FIG. 4, the DM/DBI input control section 231 includes first to eighth input control parts 231-1 to 231-8. The detailed configuration with respect to the first input control part 231-1 is explained below. The detailed configuration of each second to eighth input control part 231-2 to 231-8 may be the same as that of the first input control part 231-1. Therefore, explanations for the second to eighth input control parts 231-2 to 231-8 are omitted to avoid unnecessary repetition.

The first input control part 231-1 outputs the first DM/DBI information signal DM/DBI_int<0> of the DM/DBI information signals DM/DBI_int<0:7> as the first signal CTRLA<0> of the first data control signals CTRLA<0:7> when the DM enable signal DM_en is enabled, and outputs the first DM/DBI information signal DM/DBI_int<0> of the DM/DBI information signals DM/DBI_int<0:7> as the first signal CTRLB<0> of the second data control signals CTRLB<0:7> when the DBI enable signal DBI_en is enabled.

The first input control part 231-1 includes first and second NAND gates ND11 and ND12, and first and second inverters IV11 and IV12. The first NAND gate ND11 is inputted with the DM enable signal DM_en and the first DM/DBI information signal DM/DBI_int<0>. The second NAND gate ND12 is inputted with the DBI enable signal DBI_en and the first DM/DBI information signal DM/DBI_int<0>. The first inverter IV11 is inputted with the output signal of the first NAND gate ND11, and outputs the first first data control signal CTRLA<0>. The second inverter IV12 is inputted with the output signal of the second NAND gate ND12, and outputs the first second data control signal CTRLB<0>.

The second input control part 231-2 outputs the second DM/DBI information signal DM/DBI_int<1> of the DM/DBI information signals DM/DBI_int<0:7> as the second signal CTRLA<1> of the first data control signals CTRLA<0:7> when the DM enable signal DM_en is enabled, and outputs the second DM/DBI information signal DM/DBI_int<1> of the DM/DBI information signals DM/DBI_int<0:7> as the second signal CTRLB<1> of the second data control signals CTRLB<0:7> when the DBI enable signal DBI_en is enabled.

The third input control part 231-3 outputs the third DM/DBI information signal DM/DBI_int<2> of the DM/DBI information signals DM/DBI_int<0:7> as the third signal CTRLA<2> of the first data control signals CTRLA<0:7> when the DM enable signal DM_en is enabled, and outputs the third DM/DBI information signal DM/DBI_int<2> of the DM/DBI information signals DM/DBI_int<0:7> as the third signal CTRLB<2> of the second data control signals CTRLB<0:7> when the DBI enable signal DBI_en is enabled.

The fourth input control part 231-4 outputs the fourth DM/DBI information signal DM/DBI_int<3> of the DM/DBI information signals DM/DBI_int<0:7> as the fourth signal CTRLA<3> of the first data control signals CTRLA<0:7> when the DM enable signal DM_en is enabled, and outputs the fourth DM/DBI information signal DM/DBI_int<3> of the DM/DBI information signals DM/DBI_int<0:7> as the fourth signal CTRLB<3> of the second data control signals CTRLB<0:7> when the DBI enable signal DBI_en is enabled.

The fifth input control part 231-5 outputs the fifth DM/DBI information signal DM/DBI_int<4> of the DM/DBI information signals DM/DBI_int<0:7> as the fifth signal CTRLA<4> of the first data control signals CTRLA<0:7> when the DM enable signal DM_en is enabled, and outputs the fifth DM/DBI information signal DM/DBI_int<4> of the DM/DBI information signals DM/DBI_int<0:7> as the fifth signal CTRLB<4> of the second data control signals CTRLB<0:7> when the DBI enable signal DBI_en is enabled.

The sixth input control part 231-6 outputs the sixth DM/DBI information signal DM/DBI_int<5> of the DM/DBI information signals DM/DBI_int<0:7> as the sixth signal CTRLA<5> of the first data control signals CTRLA<0:7> when the DM enable signal DM_en is enabled, and outputs the sixth DM/DBI information signal DM/DBI_int<5> of the DM/DBI information signals DM/DBI_int<0:7> as the sixth signal CTRLB<5> of the second data control signals CTRLB<0:7> when the DBI enable signal DBI_en is enabled.

The seventh input control part 231-7 outputs the seventh DM/DBI information signal DM/DBI_int<6> of the DM/DBI information signals DM/DBI_int<0:7> as the seventh signal CTRLA<6> of the first data control signals CTRLA<0:7> when the DM enable signal DM_en is enabled, and outputs the seventh DM/DBI information signal DM/DBI_int<6> of the DM/DBI information signals DM/DBI_int<0:7> as the seventh signal CTRLB<6> of the second data control signals CTRLB<0:7> when the DBI enable signal DBI_en is enabled.

The eighth input control part 231-8 outputs the eighth DM/DBI information signal DM/DBI_int<7> of the DM/DBI information signals DM/DBI_int<0:7> as the eighth signal CTRLA<7> of the first data control signals CTRLA<0:7> when the DM enable signal DM_en is enabled, and outputs the eighth DM/DBI information signal DM/DBI_int<7> of the DM/DBI information signals DM/DBI_int<0:7> as the eighth signal CTRLB<7> of the second data control signals CTRLB<0:7> when the DBI enable signal DBI_en is enabled.

Figure 5:
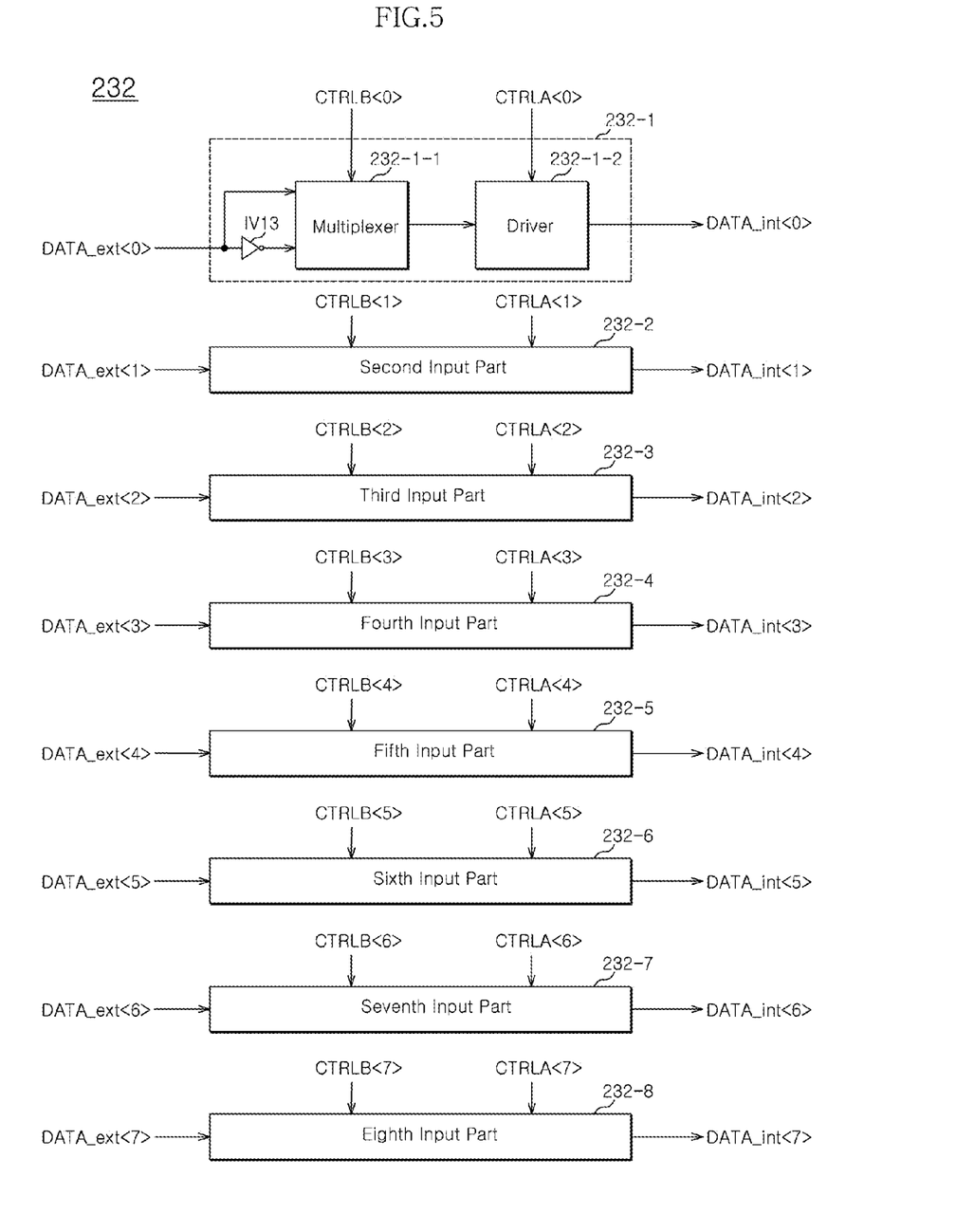
FIG. 5 is a configuration diagram of the data input section shown in FIG. 1.

As shown in FIG. 5, the data input section 232 includes first to eighth input parts 232-1 to 232-8. The detailed configuration with respect to first input part 232-1 is explained below. The detailed configuration of each second to eighth input part 232-2 to 232-8 may be the same as that of the first input part 232-1. Therefore, explanations for the second to eighth input part 232-2 to 232-8 are omitted to avoid unnecessary repetition.

The first input part 232-1 outputs or masks off the first internal data DATA_int<0> of the internal data DATA_int<0:7> in response to the first signal CTRLA<0> of the first data control signals CTRLA<0:7>. Also, the first input part 232-1 outputs the first data DATA_ext<0> or inverted signal thereof as the first internal data DATA_int<0> in response to the first signal CTRLB<0> of the second data control signals CTRLB<0:7>.

The first input part 232-1 includes a third inverter IV13, a multiplexer 232-1-1, and a driver 232-1-2. The third inverter IV13 is inputted with the first data DATA_ext<0>. The multiplexer 232-1-1 outputs the first data DATA_ext<0> or inverted signal of the third inverter IV13 in response to the first signal CTRLB<0> of the second data control signals CTRLB<0:7>. The driver 232-1-2 may allow the data to pass through it or mask the data being outputted in response to the first first data control signal CTRLA<0>. For example, the driver 232-1-2 allows the signal, which has been outputted from the multiplexer 232-1-1, to pass through it when it is activated in response to the first first data control signal CTRLA<0>, and prevents the signal from passing through it when it is deactivated.

The second input part 232-2 outputs or masks off the second internal data DATA_int<1> of the internal data DATA_int<0:7> in response to the second signal CTRLA<1> of the first data control signals CTRLA<0:7>. Also, the second input part 232-2 outputs the second data DATA_ext<1> or inverted signal thereof as the second internal data DATA_int<1> in response to the second signal CTRLB<1> of the second data control signals CTRLB<0:7>.

The third input part 232-3 outputs or masks off the third internal data DATA_int<2> of the internal data DATA_int<0:7> in response to the third signal CTRLA<2> of the first data control signals CTRLA<0:7>. Also, the third input part 232-3 outputs the third data DATA_ext<2> or inverted signal thereof as the third internal data DATA_int<2> in response to the third signal CTRLB<2> of the second data control signals CTRLB<0:7>.

The fourth input part 232-4 outputs or masks off the fourth internal data DATA_int<3> of the internal data DATA_int<0:7> in response to the fourth signal CTRLA<3> of the first data control signals CTRLA<0:7>. Also, the fourth input part 232-4 outputs the fourth data DATA_ext<3> or inverted signal thereof as the fourth internal data DATA_int<3> in response to the fourth signal CTRLB<3> of the second data control signals CTRLB<0:7>.

The fifth input part 232-5 outputs or masks off the fifth internal data DATA_int<4> of the internal data DATA_int<0:7> in response to the fifth signal CTRLA<4> of the first data control signals CTRLA<0:7>. Also, the fifth input part 232-5 outputs the fifth data DATA_ext<4> or inverted signal thereof as the fifth internal data DATA_int<4> in response to the fifth signal CTRLB<4> of the second data control signals CTRLB<0:7>.

The sixth input part 232-6 outputs or masks off the sixth internal data DATA_int<5> of the internal data DATA_int<0:7> in response to the sixth signal CTRLA<5> of the first data control signals CTRLA<0:7>. Also, the sixth input part 232-6 outputs the sixth data DATA_ext<5> or inverted signal thereof as the sixth internal data DATA_int<5> in response to the sixth signal CTRLB<5> of the second data control signals CTRLB<0:7>.

The seventh input part 232-7 outputs or masks off the seventh internal data DATA_int<6> of the internal data DATA_int<0:7> in response to the seventh signal CTRLA<6> of the first data control signals CTRLA<0:7>. Also, the seventh input part 232-7 outputs the seventh data DATA_ext<6> or inverted signal thereof as the seventh internal data DATA_int<6> in response to the seventh signal CTRLB<6> of the second data control signals CTRLB<0:7>.

The eighth input part 232-8 outputs or masks off the eighth internal data DATA_int<7> of the internal data DATA_int<0:7> in response to the eighth signal CTRLA<7> of the first data control signals CTRLA<0:7>. Also, the eighth input part 232-8 outputs the eighth data DATA_ext<7> or inverted signal thereof as the eighth internal data DATA_int<7> in response to the eighth signal CTRLB<7> of the second data control signals CTRLB<0:7>.

Operations of the semiconductor memory apparatus and the system using the same in accordance with the embodiment of the present disclosure, configured as mentioned above, will be described below.

Referring to FIG. 1, the address control unit 110 outputs the addresses ADD<0:15>.

The DM/DBI control unit 120 outputs the DM/DBI information signals DM/DBI_ext<0:7>.

The selective output unit 130 outputs the first partial addresses ADD<8:15> as the selection signals SEL<0:7> when the command COM_ext is not the read command or the write command, whereas the selective output unit 130 outputs the DM/DBI information signals DM/DBI_ext<0:7> as the selection signals SEL<0:7> when the command COM_ext is the read command or the write command.

The data output unit 140 outputs the data DATA_ext<0:7>.

The command control unit 150 outputs the command COM_ext for controlling the semiconductor memory apparatus 200.

The controller 100 including the address control unit 110, the DM/DBI control unit 120, the selective output unit 130, the data output unit 140 and the command control unit 150 provides the first partial addresses ADD<8:15> or the DM/DBI information signals DM/DBI_ext<0:7>, as the selection signals SEL<0:7>, using the same signal lines. In other words, the controller 100 outputs the first partial addresses ADD<8:15>, using the signal lines, as the selection signals SEL<0:7> when the command COM_ext is the read command or the write command, and outputs the DM/DBI information signals DM/DBI_ext<0:7>, using the same signal lines, as the selection signals SEL<0:7> when the command COM_ext is not the read command or the write command.

The selective input unit 210 outputs the selection signals SEL<0:7> as the DM/DBI information signals DM/DBI_int<0:7> when the internal command COM_int is the read command or the write command, and outputs the selection signals SEL<0:7> as the selection addresses ADD_sel<0:7> when the internal command COM_int is not the read command or the write command.

The address input unit 220 receives the second partial addresses ADD<0:7> and the selection addresses ADD_sel<0:7>. The second partial addresses ADD<0:7> are outputted from the address control unit 110 of the controller 100.

The DM/DBI input control section 231 generates the first data control signals CTRLA<0:7> and the second data control signals CTRLB<0:7> in response to the DM/DBI information signals DM/DBI_int<0:7>, the DM enable signal DM_en and the DBI enable signal DBI_en. In detail, the DM/DBI input control section 231 outputs the DM/DBI information signals DM/DBI_int<0:7> as the first data control signals CTRLA<0:7> when the DM enable signal DM_en is enabled, and outputs the DM/DBI information signals DM/DBI_int<0:7> as the second data control signals CTRLB<0:7> when the DBI enable signal DBI_en is enabled.

In an embodiment of the present invention, the second data control signals CTRLB<0:7> may determine whether the data input section 232 will invert the data inputted thereto, and the first data control signals CTRLA<0:7> may determine whether the data input section 232 will mask off the data being outputted. According to what the first and second data control signals CTRLA<0:7> and CTRLB<0:7> are, the data input section 232 may output the data DATA_ext<0:7> or inverted data thereof, or may mask off the data being outputted.

The command input unit 240 may output the command COM_ext outputted from the command control unit 150 of the controller 100, as the internal command COM_int.

The semiconductor memory apparatus 200 including the selective input unit 210, the address input unit 220, the data processing unit 230, which includes the DM/DBI input control section 231 and the data input section 232, and the command input unit 240 uses the selection signals SEL<0:7> as the DM/DBI information signals DM/DBI_int<0:7> when the read command or the write command is activated and uses the selection signals SEL<0:7> as the selection addresses ADD_sel<0:7> when the read command and the write command are not activated.

In the semiconductor memory apparatus and the system using the same in accordance with the embodiment of the present disclosure, since both the addresses and DM/DBI information signals may be transmitted as selection signals, both the addresses and DM/DBI information signals may be transmitted through one group of signal lines. Therefore, the number of signal lines necessary for a semiconductor memory apparatus to communicate with a controller may decrease. In addition, this technique may allow the semiconductor memory apparatus to perform more operations without increasing the number of signal lines.

In the write operation, the controller sends addresses to the semiconductor memory apparatus to assign the memory cells where data will be stored. In the read operation, the controller sends addresses so that the semiconductor memory apparatus can locate the memory cells where the data are stored. The addresses for memory cells consist of column addresses and row addresses. Since the row addresses need more information than the column addresses, the semiconductor memory apparatus generally requires more address lines in the transmission of row addresses than that of column addresses. Accordingly, the number of signal lines through which addresses are transmitted is determined based on the row addresses.

In an embodiment of the present invention, the semiconductor memory apparatus receives row addresses when read and write commands are not activated (e.g., when an active command is activated) and receives column addresses when the read command or the write command is activated. As described above, the semiconductor memory apparatus generally requires less address lines in the transmission of column addresses than that of row addresses. Therefore, there are signal lines not being used in the transmission of column addresses but being used in the transmission of row addresses. In an embodiment of the present invention, when the read and write commands are not activated, for example, when an active command is activated, the semiconductor memory apparatus may receive row addresses, whereas when the read command or the write command is activated, the semiconductor memory apparatus may receive not only column addresses but also DM/DBI information signals. The semiconductor memory apparatus may receive DM/DBI information signals using the signal lines not being used in the transmission of column addresses. In an embodiment of the present invention, the semiconductor memory apparatus may receive any signals other than DM/DBI information signals using the signal lines not being used in the transmission of column addresses.

While certain embodiments have been described above, it will be understood to those skilled in the art that the embodiments described are by way of example only. Accordingly, the semiconductor memory apparatus and the system using the same described herein should not be limited based on the described embodiments. Rather, the semiconductor memory apparatus and the system using the same described herein should only be limited in light of the claims that follow when taken in conjunction with the above description and accompanying drawings.

What is claimed is:

1. A semiconductor memory apparatus comprising:
    a command input unit configured to generate an internal command in response to an external command; and
    a selective input unit configured to transmit selection addresses to a first internal circuit and data masking/data bus inversion (DM/DBI) information signals to a second internal circuit, wherein the selective input unit transmits the selection addresses to the first internal circuit when the internal command is not activated and transmits the DM/DBI information signals to the second internal circuit when the internal command is activated.

2. The semiconductor memory apparatus according to claim 1, wherein the activated internal command comprises a read command and a write command.

3. The semiconductor memory apparatus according to claim 2,
wherein the selective input unit transmits selection signals to the second internal circuit when the internal command is one of the read command and the write command, and
wherein the selective input unit transmits the selection signals to the first internal circuit when the internal command is an active command.

4. The semiconductor memory apparatus according to claim 3,
wherein the first internal circuit comprises an address input unit which is inputted with the selection signals as address signals, and
wherein the second internal circuit comprises a data processing unit which is inputted with the selection signals as the DM/DBI information signals.

5. The semiconductor memory apparatus according to claim 4, wherein the data processing unit comprises:
a DM/DBI input control section configured to generate first data control signals and second data control signals in response to a DM enable signal, a DBI enable signal and the DM/DBI information signals; and
a data input section configured to determine whether to invert the data inputted thereto by using the second data control signals, and determine whether to mask off the data being outputted by using the first data control signals.

6. The semiconductor memory apparatus according to claim 5,
wherein the DM/DBI input control section outputs the DM/DBI information signals as the first data control signals when the DM enable signal is enabled, and outputs the DM/DBI information signals as the second data control signals when the DBI enable signal is enabled, and
wherein the data input section masks off the data being outputted when the first data control signals are inputted, and inverts the data inputted thereto when the second data control signals are inputted.

7. A semiconductor memory apparatus comprising:
an address input unit configured to receive first partial addresses in the form of selection address and second partial addresses in the form of address;
a data processing unit configured to receive data and DM/DBI information signals; and
a selective input unit configured to transmit selection signals, which are inputted from an exterior, as the selection addresses when an internal command is not activated and as the DM/DBI information signals when the internal command is activated, wherein the selection addresses are transmitted to the address input unit and the DM/DBI information signals are transmitted to the data processing unit.

8. The semiconductor memory apparatus according to claim 7,
wherein the address input unit receives the entire addresses when an active command is inputted to the semiconductor memory apparatus, and
wherein the address input unit receives only the second partial addresses from the controller when one of a read command and a write command is inputted to the semiconductor memory apparatus.

9. The semiconductor memory apparatus according to claim 7, wherein the data processing unit inverts data corresponding to the DM/DBI information signals when DM enable signal is enabled and mask off data being transmitted when DBI enable signal is enabled.

10. The semiconductor memory apparatus according to claim 7,
wherein the selective input unit outputs the selection signals as the DM/DBI information signals when one of the read command and the write command is inputted, and
wherein the selective input unit outputs the selection signals as the selection addresses when an inputted command is not the read nor write command.

11. A system comprising:
a controller configured to output addresses, selection signals, data and commands; and
a semiconductor memory apparatus configured to be inputted with the addresses, the selection signals, the data and the commands, and use the selection signals as first partial addresses when the commands are not activated and use the selection signals as DM/DBI information signals when the commands are activated.

12. The system according to claim 11, wherein the controller outputs the first partial addresses as the selection signals when a predetermined command is not activated and outputs the DM/DBI information signals as the selection signals when a predetermined command is factivated.

13. The system according to claim 12, wherein the controller outputs the DM/DBI information signals as the selection signals when a predetermined command is activated, and outputs the first partial addresses as the selection signals when the predetermined command is not activated.

14. The system according to claim 13, wherein the controller comprises:
an address control unit configured to output the addresses;
a DM/DBI control unit configured to output the DM/DBI information signals;
a selective output unit configured to be inputted with the first partial addresses and the DM/DBI information signals, and output one of the first partial addresses and the DM/DBI information signals, as the selection signals depending on whether the predetermined command is activated;
a data output unit configured to output the data; and
a command control unit configured to output commands for operating the semiconductor memory apparatus.

15. The system according to claim 14, wherein the selective output unit outputs the DM/DBI information signals as the selection signals when a command outputted from the command control unit is one of a read command and a write command, and outputs the first partial addresses as the selection signals when the command is a command other than the read command and the write command.

16. The system according to claim 11, wherein the semiconductor memory apparatus comprises:
an address input unit configured to receive second partial addresses, which are outputted from the address control unit of the controller, and selection addresses;
a selective input unit configured to output the selection signals as one of the selection addresses and DM/DBI information signals depending on whether the predetermined command, which is outputted from the command control unit of the controller, is activated;
a data processing unit configured to invert the data inputted thereto or mask off the data being outputted by using the first data control signals in response to the data outputted from the data output unit of the controller and the DM/DBI information signals; and a command input unit configured to generate an internal command for controlling an operation of the semiconductor memory apparatus in response to the command outputted from the command control unit of the controller.

17. The system according to claim 16, wherein the selective input unit transmits the selection signals as the DM/DBI information signals to the data processing unit when the read command or the write command is activated, and transmits the selection signals as the selection addresses to the address input unit when the read and write commands are not activated.

18. The system according to claim 16, wherein the data processing unit comprises:
 a DM/DBI input control section configured to generate first data control signals and second data control signals in response to a DM enable signal, a DBI enable signal and the DM/DBI information signals; and
 a data input section configured to determine whether to invert the data inputted thereto by using the second data control signals, and determine whether to mask off the data being outputted by using the first data control signals.

19. The system according to claim 18, wherein the DM/DBI input control section outputs the DM/DBI information signals as the first data control signals when the DM enable signal is enabled, and outputs the DM/DBI information signals as the second data control signals when the DBI enable signal is enabled.

20. The system according to claim 18, wherein the data input section masks off the data being outputted when the first data control signals are inputted, and inverts the data inputted thereto when the second data control signals are inputted.

* * * * *